(12) United States Patent
Reverchon et al.

(10) Patent No.: US 10,872,997 B2
(45) Date of Patent: Dec. 22, 2020

(54) PHOTODETECTOR COMPRISING A STACK OF VERTICALLY ADJACENT LAYERS

(71) Applicants: THALES, Courbevoie (FR); COMMISSARIAT À L'ÉNERGIE ATOMIQUE ET AUX ÉNERGIES ALTERNATIVES, Paris (FR)

(72) Inventors: Jean-Luc Reverchon, Palaiseau (FR); Philippe Bois, Palaiseau (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/762,940

(22) PCT Filed: Sep. 23, 2016

(86) PCT No.: PCT/EP2016/072760
§ 371 (c)(1),
(2) Date: Mar. 23, 2018

(87) PCT Pub. No.: WO2017/051005
PCT Pub. Date: Mar. 30, 2017

(65) Prior Publication Data
US 2018/0233619 A1    Aug. 16, 2018

(30) Foreign Application Priority Data

Sep. 25, 2015 (FR) .................................... 15 01985

(51) Int. Cl.
*H01L 31/109*    (2006.01)
*H01L 31/0304*   (2006.01)
(Continued)

(52) U.S. Cl.
CPC ...... *H01L 31/109* (2013.01); *H01L 31/02161* (2013.01); *H01L 31/03046* (2013.01); *H01L 31/035272* (2013.01); *H01L 31/09* (2013.01)

(58) Field of Classification Search
None
See application file for complete search history.

(56) References Cited

U.S. PATENT DOCUMENTS 5,016,073 A    5/1991  Elliott et al.
6,809,350 B1  10/2004  Berger et al.
(Continued)

FOREIGN PATENT DOCUMENTS

EP    0967662 A1    12/1999
WO    2005/004243 A1   1/2005

OTHER PUBLICATIONS

International Search Report, dated Jan. 16, 2017, from corresponding PCT application No. PCT/EP2016/072760.

*Primary Examiner* — Eva Y Montalvo
*Assistant Examiner* — Kien C Ly
(74) *Attorney, Agent, or Firm* — Nixon & Vanderhye

(57) ABSTRACT

Disclosed is a photodetector which includes, in series along a stacking direction: a first layer forming a substrate of a first semiconductor material; a second layer forming a photoabsorbent layer of a second semiconductor material having a second gap; a third layer forming a barrier layer of a third semiconductor material; and a fourth layer forming a window layer of a fourth semiconductor material, the first material, the third material and the fourth material each having a gap larger than the second gap, the fourth material being n-doped or non-doped and the third material being non-doped or lightly p-doped when the second material is n-doped, and the fourth material being p-doped or non-
(Continued)

doped and the third material being non-doped or lightly n-doped when the second material is p-doped.

14 Claims, 4 Drawing Sheets

(51) Int. Cl.
  *H01L 31/0352* (2006.01)
  *H01L 31/0216* (2014.01)
  *H01L 31/09* (2006.01)

(56) References Cited

U.S. PATENT DOCUMENTS

| | | | |
|---|---|---|---|
| 8,835,979 | B1 | 9/2014 | De Lyon et al. |
| 2006/0186501 | A1* | 8/2006 | Ishimura ............... H01L 31/107 257/436 |
| 2008/0111152 | A1 | 5/2008 | Scott et al. |
| 2009/0256231 | A1 | 10/2009 | Klipstein |
| 2015/0295108 | A1* | 10/2015 | Wei ................. H01L 31/035236 257/21 |
| 2017/0040477 | A1* | 2/2017 | Arikata ............. H01L 31/02161 |

* cited by examiner

PHOTODETECTOR COMPRISING A STACK OF VERTICALLY ADJACENT LAYERS

BACKGROUND OF THE INVENTION

Field of the Invention

The present invention relates to a photodetector comprising a stack of superimposed layers.

The present invention further relates to a method of manufacturing such a photodetector.

Description of the Related Art

Photodetectors comprising a photo-absorbing layer of semiconductor material are used in the field of infrared imaging. A photo-absorbing layer is a photon-absorbing layer of a predefined wavelength range.

The use of a continuous and planar photosorbent layer, i.e. without mesa, is usually sought in order to limit the risk of degradation of the photodetector. A mesa is a protruding semiconductor structure having a flat top and steep lateral sides.

To improve the performance of the absorption layer, barrier layers are generally superimposed on either side of the absorption layer. A barrier layer is a layer preventing the passage of minority carriers and therefore limiting the dark current. The dark current has Auger generation-recombination, diffusion or recombination components with different thermal activation laws.

U.S. Pat. No. 5,016,073 describes, in particular, the insertion of a barrier layer to limit the injection of minority carriers in the absorbent region. The effect of a barrier layer on the diffusion current is also explained in the article by G. Marre et al. Entitled "Strategy for the design of a non-cryogenic quantum infrared detector" published in 2003 in volume 18 of Semiconductor Science and Technology on pages 284-291.

In the case of cryogenic detectors, the reduction of the generation-recombination current by adequate doping is explained in U.S. Pat. No. 5,016,073, as well as in the article by M. Carras et al. entitled "Generation-recombination reduction in InAsSb photodiodes" published in 2006 in volume 21 of the journal Semiconductor Science and Technology on pages 1720 to 1723.

The barrier layers introduced must be sufficiently thick and have sufficient energy for the tunnel effect to be considered negligible. The tunneling effect refers to the property of a quantum object, such as an electron, to move through a potential barrier while the energy of the object is less than the minimum energy required to move through the barrier.

The materials of the barrier layers are chosen, in particular, from alloys close to the mesh agreement on a gallium antimonide (GaSb) substrate. In particular, the materials of the barrier layers are chosen so as not to give rise to inter-band tunneling effects as presented in the article by J. N. Schulman et al. entitled "Sb-heterostructure interband backward diodes" published in July 2000 in volume 21 of the IEEE Electron Device Letters review on pages 353-355. Intermediate layers of materials may therefore be appropriately introduced as described in the article by M. Carras et al. entitled "Band gap engineering in InAsSb photodiodes" published in 2005 in volume 87 of the journal Applied Physics Letters on pages 102103 to 102103-3.

A semiconductor structure is known, in particular, from US 2008/0111152, wherein it comprises, in particular, a barrier layer superimposed on an absorption layer. The material of the barrier layer and the doping of the material are chosen so that the space charge zone is located outside the absorption layer. When the component is polarized, the presence of an electric field in the barrier layer is described in WO2005/004243 and US2009/0256231. In particular, US2009/0256231 discloses a carrier band structure configuration with accumulation of carriers in proximity to the barrier layer in the absence of a strictly flat band allowing the Shockley Read Hall generation current to be limited. This solution is a special case for avoiding a space charge zone in the active zone. The choice of doping of the material is, for example, already mentioned in the article by G. Marre et al. entitled "Strategy for the design of a non-cryogenic quantum infrared detector" published in 2003 in volume 18 of the journal Semiconductor Science and Technology on pages 284-291, and the article by M. Carras et al. entitled "Generation-recombination reduction in InAsSb photodiodes" published in 2006 in volume 21 of the journal Semiconductor Science and Technology on pages 1720 to 1723.

However, parasitic effects of surface recombination are likely to occur at the surface of the barrier layer. The parasitic effects of surface recombination are, in particular, the generation of dark current, flicker noise or RTS noise. The dark current is a current from the non-radiative generation of electron-hole pairs. Flicker noise is an electronic noise resulting from the superimposition of several phenomena leading to the appearance of signals at different characteristic frequencies. For example, flicker noise may be due to impurities in a material or to parasitic electron-hole recombinations. The RTS (Random Telegraph Signal) noise is an electronic noise due to an excess of current flowing through an electrical fault sometimes correlated with a crystal defect.

Such effects are at the origin of spatial noise within the photodiode array. The concept of spatial noise in a system is a function to describe the non-uniformity of the system.

BRIEF SUMMARY OF THE INVENTION

An object of the invention is, therefore, to reduce the parasitic effects of surface recombination in a photodetector while maintaining good quantum efficiency of the photodetector. The quantum efficiency of a photodetector refers to the ratio of the number of electronic charges produced by the photodetector and the number of photons absorbed by the photodetector.

For this purpose, the invention relates to a photodetector comprising a stack of superimposed layers, wherein the photodetector comprises, successively in a stacking direction:

a first layer forming a substrate made of a first semiconductor material, a second layer forming a photo-absorbent layer made of a second semiconductor material having a second gap, a third layer forming a barrier layer made of a third semiconductor material, and a fourth layer forming a window layer made of a fourth semiconductor material, wherein the first material, the third material and the fourth material each has a gap greater than the second gap, wherein the fourth material is n-doped or undoped when the third material is undoped or weakly p-doped when the second material is n-doped, and the fourth material is p-doped or undoped and the third material is undoped or slightly doped n when the second material is p-doped.

According to particular embodiments, the detector comprises one or more of the following characteristics, taken separately or in any technically feasible combination:

the doping level of the fourth material is between $10^{15}$ cm$^{-3}$ and $10^{17}$ cm$^{-3}$.

the thickness of the fourth layer in the stacking direction is between 100 nanometers and 500 nanometers and preferably between 200 nanometers and 300 nanometers.

the photodetector further comprises a fifth layer superimposed on the fourth layer, wherein the fourth layer is between the third layer and the fifth layer, while the fifth layer forms a passivation layer.

the photodetector further comprises a seventh layer superimposed on the fifth layer, wherein the seventh layer forms a current collection layer.

the stack of layers comprises contacts made of semiconductor material, wherein each contact has an end part in contact with the third layer.

the fourth layer comprises diffused zones, wherein the stack of layers comprises contacts made of semiconductor material, wherein each contact has an end portion in contact with at least one diffused zone.

the photodetector comprises guard rings surrounding the contacts.

the second material, the third material and the fourth material are semiconductor materials based on materials of columns IIIA and VA of the periodic table.

the fourth material is of the form GaSb$_y$As$_{1-y}$, wherein y is a number between 0 and 1, and wherein the fourth material is advantageously gallium antimonide.

The invention also relates to a method of manufacturing a photodetector as described above, wherein the method comprises an epitaxial growth step for each of the layers.

BRIEF DESCRIPTION OF THE DRAWINGS

Other features and advantages of the invention will become apparent upon reading the following description of embodiments of the invention, given by way of example only, and with reference to the drawings, wherein.

DETAILED DESCRIPTION OF THE PREFERRED EMBODIMENTS

A longitudinal direction is defined for the rest of the description. A stacking direction and a transverse direction are also defined. The stacking direction is a direction perpendicular to the longitudinal direction and is contained in a plane transverse to the longitudinal direction. The stacking direction corresponds to a general direction of propagation of the light. The transverse direction is perpendicular to the longitudinal direction and to the stacking direction. The longitudinal, stacking and transverse directions are respectively symbolized by an X axis, a Z axis and a Y axis in FIGS. 1 to 9.

In what follows, a structure formed of a stack successively comprises, in the stacking direction Z, a substrate, a light-absorbent layer, and a barrier layer. A substrate is a layer supporting other layers. The surface of the structure is the surface in the stacking direction Z of the last layer of the stack not in contact with other layers of the stack.

Figure 1:
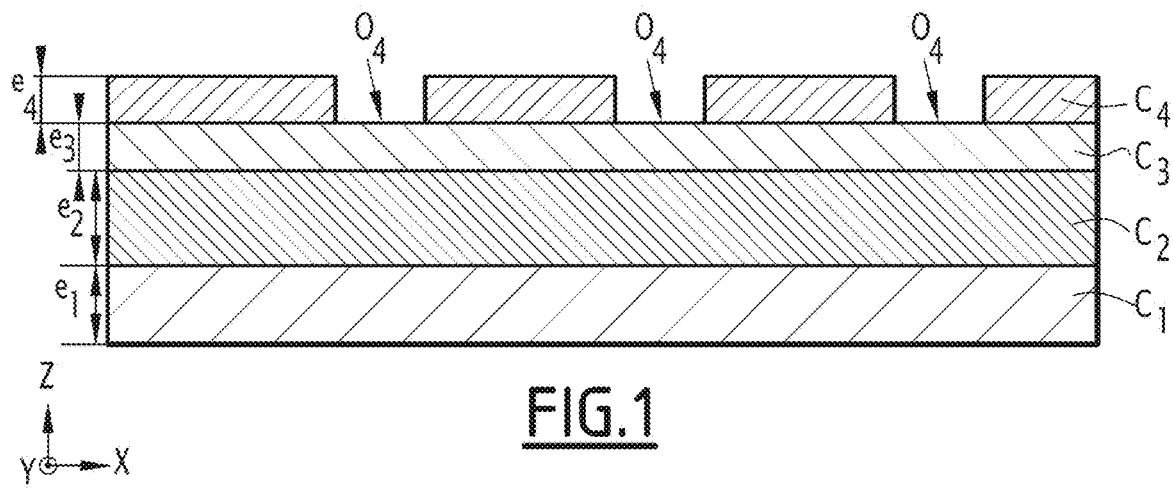
FIG. 1 shows a schematic sectional view of an exemplary photodetector according to a first embodiment.

A first approach to reduce the parasitic recombination effects of such a structure is to superimpose a first additional layer on the barrier layer. Such a structure is illustrated in FIG. 1. The material and the doping of the first additional layer are chosen to limit the parasitic recombination of charge carriers in the additional layer.

Figure 2:
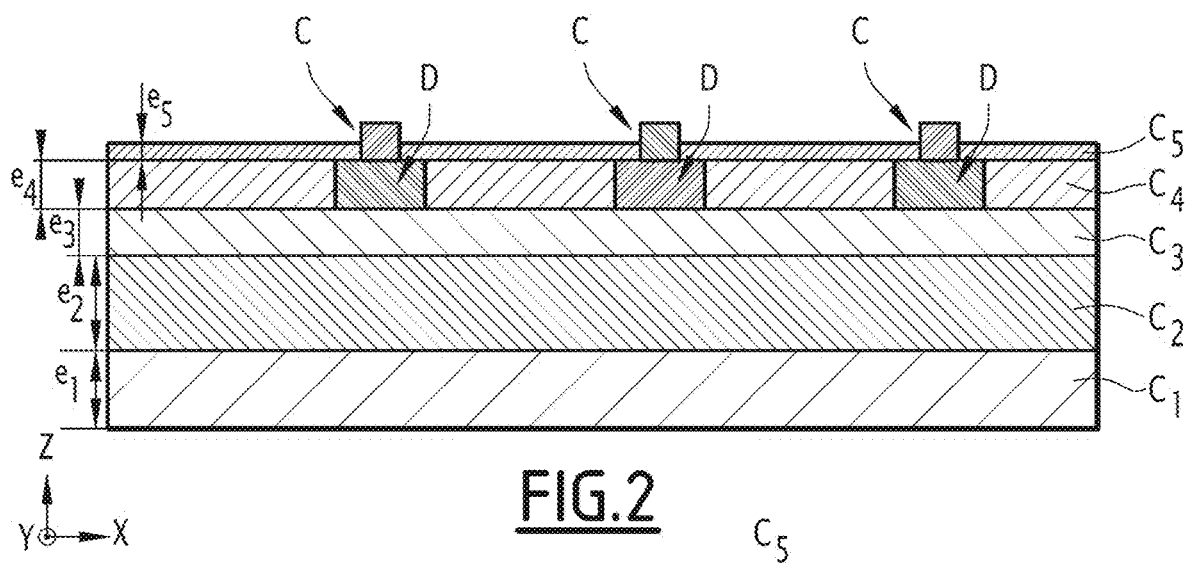
FIG. 2 shows a schematic sectional view of an exemplary photodetector according to a second embodiment.

A second approach to further reduce the parasitic recombination effects at the surface of the structure shown in FIG. 1 is to superimpose a second additional layer on the first additional layer. Such a structure is illustrated in FIG. 2, in particular. The second additional layer is a layer for passivating the structure. In fact, poor or no passivation causes a degradation over time of the functional characteristics of the photodetector. Passivation is an interface and surface treatment that is intended, on the one hand, to give the interfaces and surfaces the electronic properties required for optimal operation of a semiconductor device. On the other hand, the purpose of passivation is to stabilize the properties of the surfaces and interfaces in order to eliminate any disturbance or evolution over time of the functional characteristics of the device resulting from external physicochemical, thermal and electrical constraints. In this case, the material of the first additional layer is chosen, in particular, to promote passivation.

In what follows, different embodiments of the structure are proposed, as well as criteria for making a judicious choice of the geometry of the structure, as well as materials and doping levels of materials forming the structure. Such criteria are intended to limit the generation of parasitic noise with a single structuring.

A first embodiment of a photodetector Pd is illustrated in FIG. 1. The photodetector Pd has a spectral range of operation. The spectral range of operation of the photodetector belongs to one of the following spectral ranges: infrared, near infrared, medium infrared and far infrared. A wave belongs to the infrared range if the wavelength of the wave is broadly between 780 nanometers (nm) and 1 millimeter (mm). A wave belongs to the near infrared range if the wavelength of the wave is broadly between 780 nm and 3 micrometers (μm). A wave belongs to the average infrared range if the wavelength of the wave is broadly between 3 μm and 5 μm. A wave belongs to the far infrared range if the wavelength of the wave is broadly between 5 μm and 1 mm.

As may be seen in FIG. 1, the photodetector Pd comprises a stack of superimposed layers in the stacking direction Z. The expression "superimposed layers" is understood to mean that the layers are arranged one on the other in the stacking direction Z. The stack, therefore, comprises a succession of layers in the stacking direction Z. Each layer of the stack Z is thus defined by a thickness in the stacking direction Z. Furthermore, the stack extends in the longitudinal direction X and in the transverse direction Y, since each layer of the stack is defined by a length in the longitudinal direction X and a width in the transverse direction Y.

The stack of superimposed layers comprises, successively in the stacking direction Z, a first layer $C_1$, a second layer $C_2$, a third layer $C_3$ and a fourth layer $C_4$.

The first layer $C_1$ forms a substrate.

The first layer $C_1$ forms, in addition, a barrier layer. In the following description, the term "barrier layer" is understood to mean a layer preventing the passage of more than $10^{-3}\%$ of a type of carrier. This potential barrier is present on the valence band to block holes, or on the conduction band to block the electrons.

The first layer $C_1$ is transparent in the spectral range of operation of the photodetector Pd. The term "transparent" is understood to mean that the first layer $C_1$ absorbs less than 10% of the incident light and belongs to the spectral range of operation of the photodetector Pd when the thickness in the stacking direction Z of the first layer $C_1$ is less than ten micrometers.

The first layer $C_1$ is made of a first material $M_1$.

The first material $M_1$ is chosen to present mesh parameters permitting the epitaxial growth of one or more crystalline layers on the first material $M_1$. The mesh parameters of a crystal denote, for example, three lengths and three angles that are used to describe the crystal mesh.

The first material $M_1$ is also chosen to have mesh parameters that make it possible to avoid the formation of crystalline defects during the epitaxial growth of one or more crystals on the first material $M_1$.

The first material $M_1$ is a semiconductor.

The first material $M_1$ may be a composite material or not. A composite material is an assembly of at least two materials, wherein each material is an element or an alloy. Each material forming the first material $M_1$ belongs to one of the following columns of the periodic table: IIB, IIIA, IVA, VA and VIA. The periodic classification used is the classification based on increasing atomic number established by Moseley at the beginning of the 20th century. Group II of the Periodic Table is also called group 12. Group II includes, in particular, zinc (Zn), cadmium (Cd) and mercury (Hg). Group III of the Periodic Table is also called Group 13. Group III corresponds to the boron group and includes, in particular, boron (B), aluminum (Al), gallium (Ga) and indium (In). Group IV of the Periodic Table is also called Group 14. Group IV includes, in particular, silicon (Si) and germanium (Ge). Group V of the Periodic Table is also called Group 15 or the nitrogen family. Group V includes, in particular, nitrogen (N), phosphorus (P), arsenic (As) and antimony (Sb). Group VI of the Periodic Table is also called Group 16. Group VI includes, in particular, oxygen (O), sulfur (S) and selenium (Se). Advantageously, the materials of columns III and II may be respectively associated with materials of columns V and VI for the production of heterostructures for photodetectors. Alloys are referred to as II-VI or III-V.

The first material $M_1$ is, for example, gallium arsenide (GaAs), gallium antimonide (GaSb) or silicon (Si). Gallium arsenide and gallium antimonide have the advantage of being direct gap materials. A direct gap material is a light emitting material based on electron-hole recombination. Silicon has the advantage of being less brittle than gallium arsenide or gallium antimonide, in particular. Silicon is, moreover, available in large area formats thus greatly reducing production costs.

Optionally, in the case when the first material $M_1$ is not gallium antimonide, an additional buffer layer is superimposed on the first layer $C_1$ before the second layer $C_2$. The additional layer makes it possible to apply the first material $M_1$ of the mesh bond on the gallium antimonide.

The first material $M_1$ has a first gap $E_g^1$.

The first layer $C_1$ has a first thickness $e_1$ in the stacking direction Z. The first thickness $e_1$ is broadly between 500 nm and 600 μm.

The first layer $C_1$ also has a first length $l_1$ in the longitudinal direction X and a first width $b_1$ in the transverse direction Y. The first length $l_1$ is broadly between 100 μm and 20 mm. The first width $b_1$ is broadly between 100 μm and 20 mm for a photo-detection matrix. A photo-detection matrix is a matrix of pixels of a photodetector. The first width $b_1$ is broadly between 50 mm and 150 mm for a photodetector comprising a photo-detection matrix assembly.

The first layer $C_1$ is continuous in the longitudinal direction X, the transverse direction Y, and the stacking direction Z. A continuous layer in a given direction is a layer which does not exhibit breaks or discontinuities in the given direction.

The second layer $C_2$ forms a photo-absorbent layer. In the following description, the term "photo-absorbent layer" is understood to mean a layer absorbing at least 50% of the photons belonging to the spectral range of operation of the photodetector Pd and reaching the photo-absorbent layer.

The second layer $C_2$ is made of a second material $M_2$.

The second material $M_2$ is chosen to mesh with the first material $M_1$. The term "mesh agreement" is understood to mean that the first material $M_1$ and the second material $M_2$ have the same crystal lattice and close mesh parameters. The term "close mesh parameter" is understood to mean that the difference between the $i^{th}$ mesh parameter of a first crystal lattice and the $i^{th}$ mesh parameter of a second lattice, in connection with the first lattice, is less than 0.1 percent of the $i^{th}$ mesh parameter of the first crystal lattice.

The second material $M_2$ is a semiconductor.

The second material $M_2$ is a composite material, or not. Each material forming the second material $M_2$ belongs to one of the following columns of the periodic table: IIB, IIIA, VA and VIA. Advantageously, the second material $M_2$ is a II-VI or III-V alloy.

The second material $M_2$ is doped n or p. The term "doping n" is understood to mean the introduction of impurities in a semiconductor in order to produce an excess of electrons. The term "doping p" is understood to mean the introduction of impurities in a semiconductor in order to produce a deficit of electrons.

The doping rate of the second material $M_2$ is broadly between $10^{15}$ cm$^{-3}$ and $10^{17}$ cm$^{-3}$. The doping rate is defined as the number of doped atoms in a cubic centimeter of the crystal lattice. The doping rate is voluminal.

When the second material $M_2$ is doped n or p, the second material $M_2$ is, for example, chosen from: indium arsenide-antimonide (InAsSb), digital alloys of indium arsenide-antimonide and indium arsenide and superlattices of indium arsenide and gallium antimonide. A digital alloy is a stack of materials having different concentrations in one element. A superlattice is a periodic stack of thin layers.

The second material $M_2$ has a second gap $E_g^2$. The second gap $E_g^2$ is strictly less than the first gap $E_g^1$.

The second layer $C_2$ has a second thickness $e_2$ in the stacking direction Z. The second thickness $e_2$ is of the order of magnitude of the optical absorption length of a photon. The optical absorption length of a photon in a given material is the optical path traveled by the photon in the material before the photon is absorbed in the material according to an exponential absorption law, such as the law of Beer-Lambert. More precisely, the second thickness $e_2$ is broadly between 1 μm and 5 μm.

The second material $M_2$, the doping rate of the second material $M_2$ and the second thickness $e_2$ are chosen to avoid the positioning of the space charge zone in the second layer $C_2$, which makes it possible to avoid the generation of the Shockley Read Hall current. In fact, as explained in the article by G. Marre et al. entitled "Strategy for the design of a non-cryogenic quantum infrared detector" published in 2003 in volume 18 of the journal Semiconductor Science and Technology on pages 284-291, and the article by M. Carras et al. entitled "Generation recombination reduction in InAsSb photodiodes" published in 2006 in volume 21 of the journal Semiconductor Science and Technology on pages 1720 to 1723, the doping of the light-absorbing layer allows the extension of the space charge zone to be limited. In addition, a judicious choice of the nature and doping of the adjacent barrier layer materials enables the space charge zone to be placed in the barrier layers and to limit the generation-recombination currents in the space charge zone. The space charge zone or depletion zone is a zone free of free charge carriers. The Shockley Read Hall current is a current due to non-radiative generation-recombination of electron-hole pairs. The presence of defects or impurities in a crystal are at the origin of such non-radiative generation-recombination.

The second layer $C_2$ also has a second length $l_2$ in the longitudinal direction X, and a second width $b_2$ in the transverse direction Y. The second length $l_2$ is substantially equal to the first length $l_1$. The second width $b_2$ is substantially equal to the first width $b_1$. The expression "substantially equal" is understood to mean equal to an uncertainty of plus or minus 1% and advantageously with an uncertainty of 0%.

The second layer $C_2$ is continuous in the longitudinal direction X, the transverse direction Y and the stacking direction Z.

The third layer $C_3$ forms a barrier layer.

The third layer $C_3$ is transparent in the spectral range of operation of the photodetector Pd.

The third layer $C_3$ is made of a third material $M_3$.

The third material $M_3$ is chosen to be meshed with the second material $M_2$ or almost in agreement in the case where the third material $M_3$ is gallium aluminum antimonide (AlGaSb). The expression "quasi-mesh agreement" is understood to mean a mismatch of less than 0.05%.

The third material $M_3$ is a semiconductor.

The third material $M_3$ is a composite material, or not. Each material forming the third material $M_3$ belongs to one of the following columns of the periodic table: IIB, IIIA, VA and VIA. Advantageously, the third material $M_3$ is a II-VI or III-V alloy.

The third material $M_3$ is weakly doped or undoped. In particular, the third material $M_3$ is undoped or weakly doped n when the second material $M_2$ is p-doped, and is undoped or weakly p-doped when the second material $M_2$ is n-doped.

The doping rate of the third material $M_3$ is understood broadly between $10^{13}$ cm$^{-3}$ and $10^{16}$ cm$^{-3}$.

When the second material $M_2$, preferably InAsSb, is n-doped, the third material $M_3$ is, for example, chosen from: gallium aluminum antimonide (AlGaSb) and gallium aluminum arsenide-antimonide (AlGaAsSb). In this case, the second material $M_2$ has a strong conduction band discontinuity to block the electrons.

When the second material $M_2$ is p-doped, the third material $M_3$ is, for example, gallium antimonide.

The third material $M_3$ has a third gap $E_g^3$. The third gap $E_g^3$ is strictly greater than the second gap $E_g^2$.

The third layer $C_3$ has a third thickness $e_3$ in the stacking direction Z. The third thickness $e_3$ is broadly between 30 nm and 200 nm.

The third layer $C_3$ also has a third length $l_3$ in the longitudinal direction X and a third width $b_3$ in the transverse direction Y. The third length $l_3$ is substantially equal to the first length $l_1$. The third width $b_3$ is substantially equal to the first width $b_1$.

The third layer $C_3$ is continuous in the longitudinal direction X, the transverse direction Y, and the stacking direction Z.

The fourth layer $C_4$ forms a window layer. A window layer is a barrier layer which also makes it possible to reduce the parasitic effects of surface recombination due to the electrostatic shielding associated with the electrical doping of the fourth layer $C_4$. A window layer is, moreover, transparent in the spectral range of operation of the photodetector Pd.

The fourth layer $C_4$ is transparent in the spectral range of operation of the photodetector Pd.

The fourth layer $C_4$ is made of a fourth material $M_4$.

The fourth material $M_4$ is chosen in mesh agreement with the third material $M_3$.

The fourth material $M_4$ is chosen to be stainless in the ambient medium. The ambient medium denotes a medium formed of air at a temperature broadly between 300 K and 400 K and at a pressure broadly between $10^{-6}$ bar and 1 bar in the manufacturing phase. A stainless material in a given medium is a non-corroded material in the medium. Corroded means the alteration of a material by chemical reaction with an oxidant. An oxidant is a chemical species that captures electrons. Oxygen and the hydrogen cation are examples of oxidants.

The fourth material $M_4$ is selected to be metallurgically stable. A metallurgically-stable material is a material having a stable elemental composition and crystal lattice with a tolerance of 0.01%. Thus, the percentage in one element for each of the elements of the material does not vary by more than 0.01% over time. The lattice parameters of the crystal lattice do not vary by more than 0.01% over time.

The fourth material $M_4$ is a semiconductor.

The fourth material $M_4$ may be a composite material or not. Each material forming the fourth material $M_4$ belongs to one of the following columns of the periodic table: IIIA and VA.

The fourth material $M_4$ is undoped or slightly doped. When the third material $M_3$ is weakly p doped, the fourth material $M_4$ is doped, wherein the doping is n. When the third material $M_3$ is weakly doped n, the fourth material M4 is doped, wherein the doping is p.

The doping rate of the fourth material $M_4$ is broadly between $10^{15}$ cm$^{-3}$ and $10^{17}$ cm$^{-3}$.

The fourth material $M_4$ is generally a material of the form GaSb$_y$As$_{1-y}$, wherein y is a number broadly between 0 and 1. More particularly, the fourth material $M_4$ is, for example, gallium antimonide (GaSb).

The fourth material $M_4$ has a fourth gap $E_g^4$. The fourth gap $E_g^4$ is strictly greater than the second gap $E_g^g$.

The fourth layer $C_4$ has a fourth thickness $e_4$ in the stacking direction Z. The fourth thickness $e_4$ is broadly between 100 nm and 500 nm. Preferably, the fourth thickness is broadly between 200 nm and 300 nm.

The fourth material $M_4$, the doping rate of the fourth material $M_4$ and the fourth thickness $e_4$ are chosen to shield the surface area effect of the fourth layer $C_4$. The surface of the fourth layer $C_4$ is the surface of the fourth layer $C_4$ in the stacking direction Z which is not in contact with the third layer $C_3$. The shielding of the surface effect is the reduction of the electrostatic effect of the charges present on the surface of a semiconductor material so that less than $10^{-3}\%$ of the variation of the electrical potential is present on the surface of the material.

The stack formed by the first layer $C_1$, the second layer $C_2$, the third layer $C_3$ and the fourth layer $C_4$ is intended to form a matrix of pixels. For this, the fourth layer $C_4$ has openings $O_4$ distributed at regular intervals on the fourth layer $C_4$. Each opening $O_4$ traverses integrally the fourth layer $C_4$ in the stacking direction Z. Each opening $O_4$ delimits a portion of the third layer $C_3$. The center of each portion of the third layer $C_3$ constitutes the center of a pixel. Each pixel extends in the longitudinal X and transverse Y directions from the center of each portion of the third layer $C_3$. A pixel is therefore a portion of the stack formed by the first layer $C_1$, the second layer $C_2$ and the third layer $C_3$ and defined by the fourth layer $C_4$. The set of pixels forms a matrix of pixels.

The pixels of the pixel matrix have identical dimensions. Each pixel has a length $l_{pixel}$ in the longitudinal direction X and a width $b_{pixel}$ in the transverse direction Y. Each pixel has, in addition, a pixel thickness substantially equal to the sum of the thicknesses of the first layer $C_1$, the second layer $C_2$ and the third layer $C_3$. In the embodiment illustrated in FIG. 1, the pixel length and the pixel width of a pixel are equal and are commonly referred to as the pixel pitch. The pitch of each pixel is broadly between 2 μm and 10 μm.

The fourth layer $C_4$ is thus continuous in the stacking direction Z. On the other hand, the fourth layer $C_4$ is regularly open in the longitudinal direction X and the transverse direction Y.

Each opening $O_4$ has a thickness in the stacking direction Z that is substantially equal to the fourth thickness $e_4$ of the fourth layer $C_4$.

Each opening $O_4$ has a length in the longitudinal direction X broadly between 1 μm and 30 μm.

Each opening $O_4$ has a width in the transverse direction Y broadly between 1 μm and 30 μm.

In the embodiment illustrated in FIG. 1, each opening $O_4$ has a cylindrical shape with an axis parallel to the stacking direction Z and diameter $d_4$ broadly between 1 μm and 30 μm.

The spacing of each pair of adjacent openings $O_4$ in the longitudinal direction X is equal to the pixel length $l_{pixel}$ of a pixel. The spacing of each pair of adjacent openings $O_4$ in the transverse direction Y is equal to the width $b_{pixel}$ of a pixel. Thus, each opening $O_4$ is separated from the other openings $O_4$ by a distance equivalent to the pitch of the pixel.

The operation of the photodetector Pd according to the first embodiment of the invention will now be described.

Initially, a light flux is emitted on the photodetector Pd in back-light, i.e. from the first layer $C_1$ until the fourth layer $C_4$. The light flux comprises photons belonging to the spectral range of operation of the photodetector Pd.

The incident photons, belonging to the spectral range of operation of the photodetector Pd, pass through the first layer $C_1$, then are absorbed in the second layer $C_2$. The absorption of a photon in the second layer $C_2$ creates an electron-hole pair. The electron and the hole are then each fed into a layer where the electron, respectively the hole, is a majority carrier. The separation of the electron-hole pairs is governed by the internal electric field present in the third layer $C_3$ which is a barrier layer to the diffusion of the carriers that are blocked by the two barrier layers $C_1$ and $C_3$.

In what follows, two cases are distinguished according to the doping p or n of the second layer $C_2$.

When the second layer $C_2$ is n-doped, the hole is led into the third p-doped layer $C_3$ and the electron is recombined into the $C_1$ layer whose doping and conductivity allow the electroneutrality to be maintained throughout the component.

The electrons of the second layer $C_2$ tend to be led from the second layer $C_2$ to the third layer $C_3$ by tunnel effect. However, the third layer $C_3$ limits the passage of electrons by tunnel effect to the third layer $C_3$. The difference in gap between the third gap $E_g^3$ and the second gap $E_g^2$ is at the origin of the confinement of the electrons in the second layer $C_2$ and the evacuation of electrons through the layer $C_1$.

In contrast, the third layer $C_3$ allows the passage of the holes which are thus conveyed from the second layer $C_2$ to the third layer $C_3$.

The holes are then led within the third diffusion layer $C_3$ through the $O_4$ openings that are geographically closest to the holes.

The fourth layer $C_4$ thus makes it possible to confine the holes to the openings $O_4$ that are geographically closest to the holes. The holes are therefore not trapped on the surface of the fourth layer $C_4$ and thus do not generate electrical instabilities such as the dark current, the flicker noise or the RTS noise.

When the second layer $C_2$ is p-doped, the electron is fed into the third n-doped layer $C_3$ and the hole is recombined in layer $C_1$.

The holes in the second layer $C_2$ tend to be led from the second layer $C_2$ to the third layer $C_3$. However, the third layer $C_3$ limits the passage of holes to the third layer $C_3$. The difference in gap between the third gap $E_g^3$ and the second gap $E_g^2$ is at the origin of the confinement of the holes in the second layer $C_2$ and the evacuation of the holes through the layer $C_1$.

On the other hand, the third layer $C_3$ allows the passage of the electrons which are thus conveyed from the second layer $C_2$ to the third layer $C_3$.

The electrons are then fed into the fourth layer $C_4$ by diffusion into the $O_4$ openings geographically closest to the electrons.

The fourth layer $C_4$ thus makes it possible to confine the electrons to the $O_4$ openings geographically closest to the holes. The electrons are thus not trapped on the surface of the fourth layer $C_4$ and, therefore, do not generate electrical instabilities such as dark current, flicker noise or RTS noise.

Thus, the structure of the photodetector Pd makes it possible to reduce the parasitic effects of surface recombination, in particular the dark current, the flicker noise and the RTS noise.

The periodic $O_4$ openings within the fourth layer $C_4$ allow the formation of pixels from a single stack of layers independent of each other.

In addition, the third layer $C_3$ and the fourth layer $C_4$ are without mesas, which preserves the performance of the photodetector Pd. In fact, the photodetector Pd does not suffer from the generation of parasitic currents on the flanks of InAsSb mesas.

The photodetector Pd retains good quantum efficiency if the internal electric field in the third layer $C_3$ is sufficient or if an external potential difference is applied between the first layer $C_1$ and the third layer $C_3$.

The method of manufacturing the photodetector Pd according to the first embodiment of the invention will now be described.

The manufacturing method initially comprises providing the first layer $C_1$ forming the substrate.

Then, the manufacturing method comprises the epitaxial growth of the second layer $C_2$ on the first layer $C_1$. The term "epitaxial" is understood to mean a technique of growing a crystal on another crystal, wherein each crystal comprises a crystal lattice having a number of elements of symmetry in common with the other crystal.

The epitaxial technique used is chosen from: molecular beam epitaxy, liquid phase epitaxy and gas phase epitaxy.

The manufacturing method then comprises the epitaxial growth of the third layer $C_3$ on the second layer $C_2$.

Then, the manufacturing method comprises the epitaxial growth of the fourth layer $C_4$ on the third layer $C_3$.

Preferably, the second layer $C_2$, the third layer $C_3$ and the fourth layer $C_4$ are formed during the same epitaxy.

The method then comprises removing certain portions of the fourth layer $C_4$ to form the $O_4$ openings of the fourth layer $C_4$.

The epitaxial technique used is, for example, chosen from: dry epitaxy, wet epitaxy and plasma reactive ion epitaxy.

According to a second embodiment as shown in FIG. 2, the elements identical to the photodetector Pd according to the first embodiment described with reference to FIG. 1 are not repeated. Only the differences are highlighted.

The photodetector Pd comprises contacts C. The stack of layers further comprises, in the stacking direction Z, a fifth layer $C_5$ superimposed on the fourth layer $C_4$.

The fourth material $M_4$ is a clean material to be passivated, i.e. a material capable of being covered with a dielectric, such as silicon nitride (SiN) or silicon oxide (SiO), limiting the surface conduction.

The other characteristics of the fourth material $M_4$ are identical to the first embodiment.

The fourth layer $C_4$ has at least one diffused zone D in which a dopant is diffused. In the second embodiment, the fourth layer $C_4$ has a diffused zone D for each opening $O_4$.

Alternatively, the fourth layer C4 may comprise fewer diffused areas D than openings $O_4$ of the fourth layer $C_4$.

Each diffused zone D is in contact with the fourth layer $C_4$. In addition, each diffused zone D is in contact in the stacking direction Z with the third layer $C_3$ and with one of the contacts C.

In the second embodiment, each diffused zone D has a thickness in the stacking direction Z that is substantially equal to the fourth thickness $e_4$. Each diffused zone D has a shape that is complementary to the openings $O_4$. Thus, in the second embodiment, each diffused zone D has a cylindrical shape with a diameter equal to the diameter $d_4$ of the openings $O_4$.

Each diffused zone D is made of a semiconductor material. For example, each diffused zone D is made by diffusing a material chosen from: zinc (Zn), cadmium (Cd) and germanium (Ge) in the fourth material $M_4$ forming the fourth layer $C_4$.

Each contact C makes it possible to collect the current at the center of a pixel. Each contact C makes it possible, in particular, to make contact with the third layer $C_3$ and to convert a displacement of the current charge carriers. The matrix structure of the pixels of the photodetector is, in particular, illustrated in FIG. 3, wherein each contact C comes into contact with a pixel.

Each contact C has an end portion in the stacking direction Z. The end portion of each contact C is the portion facing the stack in the stacking direction Z. The end portion of each contact C is in contact with at least one diffused zone D in the stacking direction Z.

The C contacts are identical.

Figure 3:
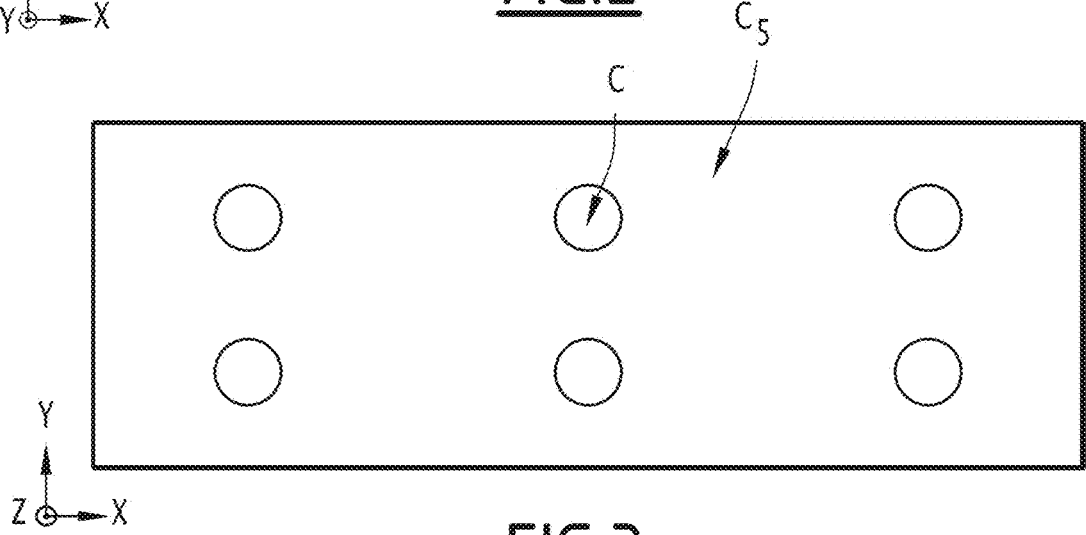
FIG. 3 shows a schematic top view of the photodetector of FIG. 2.

In the second embodiment, as illustrated in FIG. 3, each contact C has a cylindrical shape. Each contact C has a thickness in the stacking direction Z broadly between 50 nm and 200 nm and a diameter in the plane formed by the longitudinal directions X and transverse Y broadly between 2 μm and 15 μm.

Alternatively, each contact C has the shape of a parallelepiped. Each contact C thus has a thickness in the stacking direction Z broadly between 50 nm and 200 nm, a length in the longitudinal direction X broadly between 2 μm and 15 μm, and a width in the transverse direction Y broadly between 2 μm and 15 μm Each contact C is made of metallic material. For example, each contact C is made of platinum and/or gold.

Alternatively, the second material $M_2$ may be n-doped, wherein each contact C is made of a p-doped semiconductor material or else a metal that makes it possible to form an ohmic contact. The term "ohmic contact" is understood to mean a low potential energy barrier for the holes formed at the interface between a metal and a semiconductor for instant recombination of minority carriers.

When the second material $M_2$ is p-doped, each contact C is made of a metallic material adapted to the collection of electrons. This is an ohmic contact doped n.

The fifth layer $C_5$ is superimposed on the fourth layer $C_4$ and the scattered areas D in the stacking direction Z. The fourth layer $C_4$ is thus between the third layer $C_3$ and the fifth layer $C_5$.

The fifth layer $C_5$ forms a passivation layer. The fifth layer $C_5$ makes it possible to passivate the stack, and thus to protect the stack.

The fifth layer $C_5$ is made of a fifth material $M_5$.

The fifth material $M_5$ is chosen to passivate the stack.

The fifth material $M_5$ is a dielectric.

The fifth material $M_5$ is, for example, silicon nitride ($Si_3N_4$) or silica ($SiO_2$).

The fifth layer $C_5$ has a fifth thickness $e_5$ in the stacking direction Z. The fifth thickness $e_5$ is broadly between 50 nm and 500 nm.

The fifth layer $C_5$ is continuous in the stacking direction Z. On the other hand, the fifth layer $C_5$ is not continuous in the longitudinal direction X and the transverse direction Y. In fact, the fifth layer $C_5$ has several openings $O_5$ integrally passing through the fifth layer $C_5$ in the stacking direction Z.

In the second embodiment, the number of openings $O_5$ is equal to the number of contacts C.

Each opening $O_5$ has a thickness in the stacking direction Z identical to the fifth thickness $e_5$. Each opening $O_5$ has a shape complementary to the contacts C. Thus, each opening $O_5$ has a cylindrical shape with a diameter substantially equal to the diameter of the contacts C.

Each opening $O_5$ is centered on the center of a contact C in the plane formed by the transverse direction Y and the longitudinal direction X.

The fifth layer $C_5$ completely covers the fourth layer $C_4$, with the exception of the openings $O_4$ of the fourth layer $C_4$.

In what follows, only the differences in operation of the photodetector Pd according to the second embodiment with respect to the first embodiment are highlighted.

The charge carriers present in the fourth layer $C_4$ are led to the contact C via the diffused zone D. The charge carriers are, in particular, led to the contact(s) C geographically closest to the charge carriers.

Each contact C then produces a current.

Although the electrostatic shielding is provided by the fourth layer $C_4$, the fifth layer $C_5$ furthermore makes it possible to limit the oxidation of the structure and, in particular, of the first layer $C_1$ and of the third layer $C_3$ in the long term.

Thus, the fifth passivation layer $C_5$ makes it possible to reduce the parasitic surface recombination effects with respect to the first embodiment.

In addition, the arrangement and the shape of the contacts C make it possible to make contact with the signal emitted by each pixel independently of the neighboring pixel. The pixels are isolated from each other by means of the contacts C and the openings $O_4$ of the fourth layer $C_4$. A low conductivity of the third layer $C_3$ makes it possible to isolate the pixels from each other.

In what follows, only the differences in the method of manufacturing the photodetector Pd according to the second embodiment with respect to the first embodiment, are highlighted.

The method then comprises the introduction of diffused zones D into the openings $O_4$ of the fourth layer $C_4$.

The introduction technique used is, for example, vapor deposition based on organometallic precursors.

Then, the manufacturing method comprises stacking in the stacking direction Z of the contacts C on the diffused zones D.

The junction between a contact C and a diffused zone D is, for example, carried out by evaporation or sputtering of metals.

Finally, the method comprises depositing the fifth layer $C_5$ on the fourth layer $C_4$ so that the contacts C are surrounded by the fifth layer $C_5$.

Figure 4:
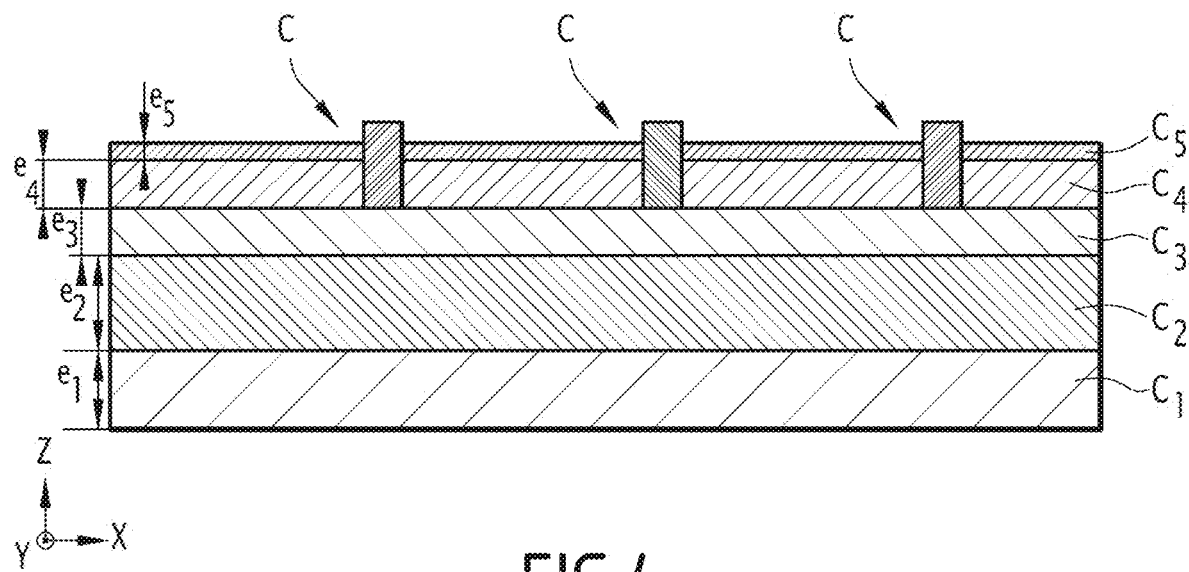
FIG. 4 shows a schematic sectional view of an exemplary photodetector according to a third embodiment.

According to a third embodiment as shown in FIG. 4, the elements identical to the photodetector Pd according to the second embodiment described with reference to FIG. 2 are not repeated. Only the differences are highlighted.

As illustrated in FIG. 4, the fourth layer $C_4$ has no diffused zones D.

Each contact C has a diameter substantially equal to the diameter of the openings $O_4$ of the fourth layer $C_4$. In this third embodiment, the fourth layer $C_4$ does not include a diffused zone D.

Each contact C has a thickness in the stacking direction Z broadly between 50 nm and 300 nm.

In addition, the end portion of each contact C is in contact with the third layer $C_3$ in the stacking direction Z.

In what follows, only the differences in operation of the photodetector Pd according to the third embodiment with respect to the second embodiment are highlighted.

Minority carriers are led directly from the fourth layer $C_4$ to each contact C.

The third embodiment allows the contact to directly contact the third layer $C_3$. Such an embodiment is simpler to implement than that of the second embodiment.

In what follows, only the differences in the method of manufacturing the photodetector Pd according to the third embodiment with respect to the second embodiment are highlighted.

After the removal step, the manufacturing method comprises introducing the contacts C into the openings $O_4$ of the fourth layer $C_4$.

The junction between a contact C and the third layer $C_3$ in the stacking direction Z is, for example, carried out by evaporation or sputtering of metals.

Figure 5:
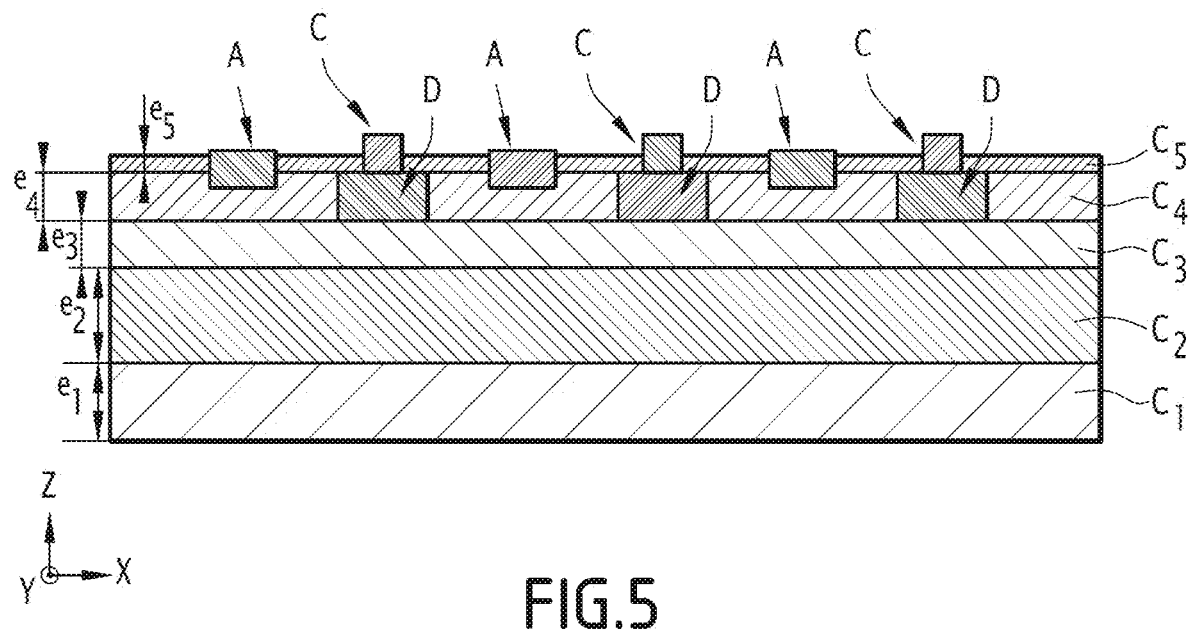
FIG. 5 shows a schematic sectional view of an exemplary photodetector according to a fourth embodiment.

According to a fourth embodiment as shown in FIG. 5, the elements identical to the photodetector Pd according to the second embodiment described with reference to FIG. 2 are not repeated. Only the differences are highlighted.

The stack of layers of the photodetector Pd comprises at least one guard ring A. In the fourth embodiment, the stack of layers has as many guard rings A as openings $O_4$ of the fourth layer $C_4$.

A guard ring is a conductor surrounding a component, such as a pixel, and is intended to promote the separation of electric currents from two neighboring pixels.

In the fourth embodiment, each guard ring A has a parallelepiped shape. Each guard ring A has a height in the stacking direction Z broadly between 50 nm and 100 nm, a length in the longitudinal direction X broadly between 1 μm and 2 μm, and a width in the transverse direction broadly between 1 and 2 μm.

Each guard ring A is, in addition, completely hollowed out in the stacking direction Z. The recess is centered on the center of the guard ring A in the plane formed by the longitudinal X and transverse Y directions. The recesses in the longitudinal X and transverse Y directions are substantially equal to the pitch of the pixels.

The guard rings A are arranged on the stack so that the contacts C are located in the center of the guard rings A.

The guard rings A delimit the pixels of the pixel matrix.

Each guard ring A is arranged to be in contact with the fourth layer $C_4$ in the stacking direction Z.

Preferably, the guard ring A is separated from the fifth layer $C_4$ by a portion of the fifth layer $C_5$ in order to avoid injecting parasitic current, and only to introduce an external potential difference.

Each guard ring A is, for example, made of metal.

The guard rings A make it possible to reduce the cross-talk between the neighboring C contacts, and therefore between the neighboring pixels. The cross-talk evaluates to what extent a photon incident on a given pixel will generate an electrical signal in the neighboring pixels. Cross-talk causes a degradation of the modulation transfer function.

The reduction of the cross-talk by the guard rings makes it possible to obtain a value of the modulation transfer function (MTF) between 55% and 65% of the Nyquist frequency, which is the theoretical frequency.

In the fourth embodiment, the fifth layer $C_5$ has recesses integrally traversing the fifth layer $C_5$ in the stacking direction Z. The recesses of the fifth layer $C_5$ have a shape that is complementary to the shape of the guard rings in the longitudinal X and transverse Y directions. The guard rings A are thus introduced into the recesses of the fifth layer $C_5$.

In addition, the fourth layer $C_4$ also has recesses of thickness less than the fourth thickness $e_4$. The recesses of the fourth layer $C_4$ have a shape that is complementary to the shape of the guard rings in the longitudinal X and transverse Y directions. The guard rings A are thus introduced into the recesses of the fourth layer $C_4$.

Thus, by reducing the cross-talk phenomenon, the guard rings make it possible to improve the spatial resolution of the photodetector Pd.

In what follows, only the differences in operation of the photodetector Pd according to the fourth embodiment with respect to the second embodiment are highlighted. The guard rings introduce a potential difference in the fourth layer $C_4$. This potential difference makes it possible to promote the drift current of the carriers from A to C and to limit the effects of crosstalk between pixels.

In what follows, only the differences in the method of manufacturing the photodetector Pd according to the fourth embodiment with respect to the second embodiment are highlighted.

The step of withdrawing portions of the fourth layer $C_4$ makes it possible, in addition, to form the recesses of the fourth layer $C_4$.

Then, the manufacturing method comprises introducing the guard rings into the recesses of the fourth layer $C_4$.

The junction between a guard ring A and the fourth layer $C_4$ is, for example, made by molecular bonding.

After the diffusion zones D and the contacts C have been arranged, the fifth layer $C_5$ is deposited on the fourth layer $C_4$ so that the contacts C and the guard rings A are surrounded by the fifth layer $C_5$.

Figure 6:
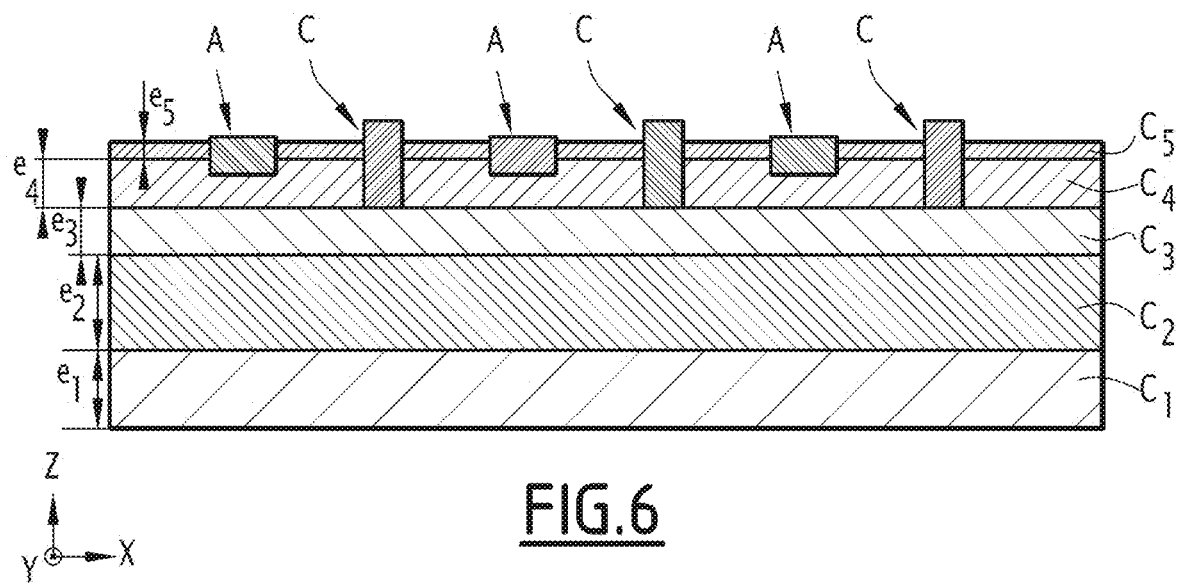
FIG. 6 shows a schematic sectional view of an exemplary photodetector according to a fifth embodiment.
Figure 7:
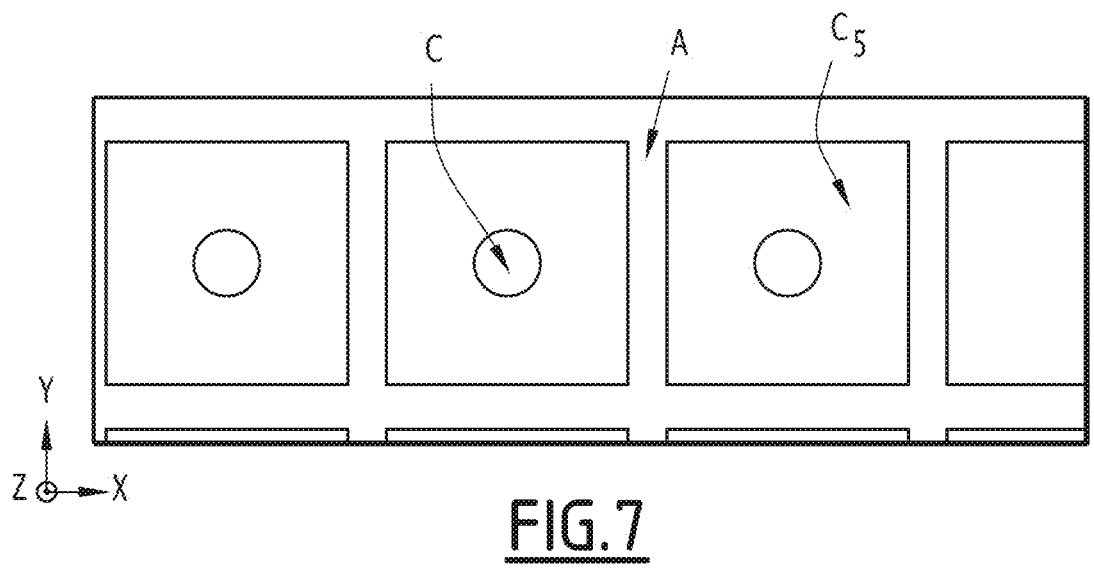
FIG. 7 shows a schematic plan view of the photodetector of FIG. 6.

A fifth embodiment, shown in FIGS. 6 and 7, describes a photodetector Pd that is identical to the photodetector Pd of the third embodiment, with the difference that the photodetector Pd of the fifth embodiment further comprises at least one guard ring.

The characteristics and comments on the guard rings formulated in the fourth embodiment apply in the fifth embodiment.

FIG. 7 shows a top view of the photodetector Pd according to the fifth embodiment. FIG. 7 shows, in particular, the matrix of pixels formed by the stack and the fact that a guard ring A makes it possible to delimit a pixel.

Figure 8:
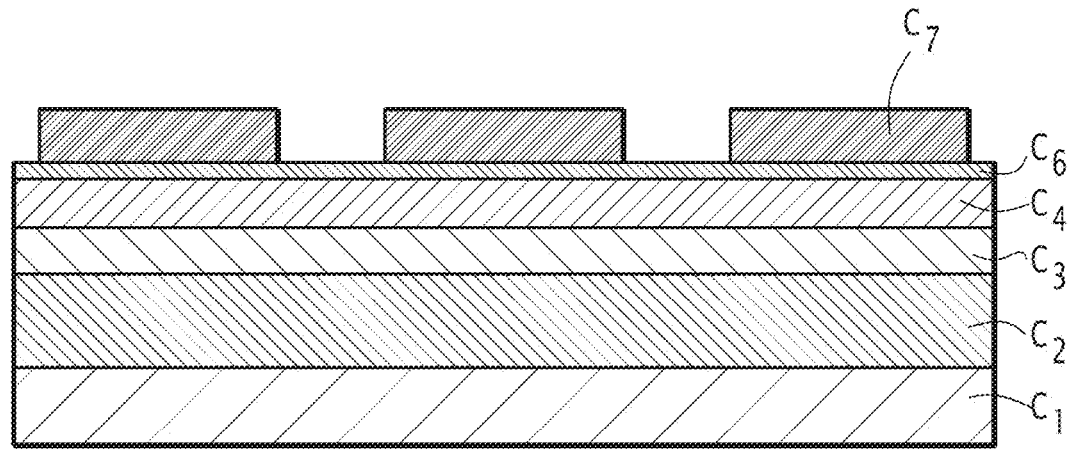
FIG. 8 shows a schematic sectional view of an exemplary photodetector according to a sixth embodiment.

According to a sixth embodiment as visible in FIG. 8, the elements identical to the photodetector Pd according to the first embodiment described with reference to FIG. 1 are not repeated. Only the differences are highlighted.

The photodetector Pd comprises a sixth layer $C_6$ stacked on the fourth layer $C_4$ and a seventh layer $C_7$ stacked on the sixth layer $C_6$.

The fourth layer $C_4$ is continuous in the stacking direction Z, the longitudinal direction X and the transverse direction Y.

The other characteristics of the fourth layer $C_4$ are identical to the first embodiment.

The sixth layer $C_6$ is stacked on the fourth layer $C_4$ in the stacking direction Z.

The sixth layer $C_6$ forms a passivation layer. The sixth layer $C_6$ makes it possible to passivate the stack, and thus to protect the stack.

The sixth layer $C_6$ is made of a sixth material $M_6$.

The sixth material $M_6$ is a semiconductor. The sixth material $M_6$ is a composite material or not. Each material forming the sixth material $M_6$ belongs to one of the following columns of the periodic table: IIB, IIIA, VA and VIA. Advantageously, the sixth material $M_6$ is a II-VI or III-V alloy. The sixth material $M_6$ is, for example, GaSb.

The sixth layer $C_6$ has a sixth thickness $e_6$ in the stacking direction Z. The sixth thickness $e_6$ is broadly between 50 nm and 500 nm.

The sixth layer $C_6$ is continuous in the stacking direction Z, the longitudinal direction X and the transverse direction Y, and completely covers the fourth layer $C_4$.

The seventh layer $C_7$ is stacked on the sixth layer $C_6$ in the stacking direction Z.

The seventh layer $C_7$ forms a current collection layer also called a contact layer. A contact layer is used to collect a current. Thus, the seventh layer $C_7$ makes it possible to collect the current coming from the fourth layer $C_4$.

The seventh layer $C_7$ is made of a material $M_7$.

The seventh material $M_7$ is a material facilitating the realization of an ohmic contact. An ohmic contact is a metal-semiconductor contact with a very low contact resistance.

The seventh material $M_7$ is doped n or p. Preferably, when the second material $M_2$ is n-doped, the seventh material $M_7$ is p-doped, and when the second material $M_2$ is p-doped, the seventh material $M_7$ is n-doped.

The doping rate of the second material $M_2$ is broadly between $1.10^{17}$ cm$^{-3}$ and $5.10^{18}$ cm$^{-3}$.

The seventh material $M_7$ is, for example, a semiconductor such as InAsSb.

The seventh material $M_7$ has a seventh gap $E_g^7$. The seventh gap $E_g^7$ is greater than or equal to the second gap $E_g^2$.

The seventh layer $C_7$ has a seventh thickness $e_7$ in the stacking direction Z. The seventh thickness $e_7$ is broadly between 100 nm and 300 nm.

The stack formed by the first layer $C_1$, the second layer $C_2$, the third layer $C_3$, the fourth layer $C_4$ and the sixth layer $C_6$ is intended to form a matrix of pixels. The seventh layer $C_7$ is able to capture the electric current coming from the pixels of the stack. For this, the seventh layer $C_7$ has portions $P_7$ distributed at regular intervals on the sixth layer $C_6$. Each part $P_7$ delimits a portion of the stack. The center of each part $P_7$ is placed at the center of a pixel in the stacking direction Z. Each pixel extends in the longitudinal X and transverse Y directions. A pixel is therefore a portion of the stack formed by the first layer $C_1$, wherein the second layer $C_2$, the third layer $C_3$, the fourth layer $C_4$, the sixth layer $C_6$ and the ohmic contact is provided by the seventh layer $C_7$. The assembly of pixels forms a matrix of pixels.

The pixels of the pixel matrix have identical dimensions. Each pixel has a length $l_{pixel}$ in the longitudinal direction X and a width $b_{pixel}$ in the transverse direction Y. Each pixel has, in addition, a pixel thickness substantially equal to the sum of the thicknesses of the first layer $C_1$, the second layer $C_2$, the third layer $C_3$, the fourth layer $C_4$ and the sixth layer $C_6$. In the embodiment illustrated in FIG. 1, the pixel length and the pixel width of a pixel are equal and are commonly referred to as pixel pitch. The pitch of each pixel is broadly between 2 μm and 10 μm.

The seventh layer $C_7$ is thus continuous in the stacking direction Z. On the other hand, the seventh layer $C_7$ has parts $P_7$ spaced apart by a regular interval in the longitudinal direction X and the transverse direction Y. The seventh length $l_7$ in the longitudinal direction X separating two consecutive portions $P_7$ is broadly between 1 μm and 5 μm. The seventh width $b_7$ in the transverse direction Y separating two consecutive portions $P_7$ is broadly between 1 μm and 5 μm.

Each portion $P_7$ has a length in the longitudinal direction X equal to the pitch of the pixel minus the seventh length $l_7$ and a width in the transverse direction Y equal to the pitch of the pixel minus the seventh width $b_7$.

The parts $P_7$ thus make it possible to form mesas, i.e. protruding semiconductor structures having a flat top and steep lateral sides.

Figure 9:
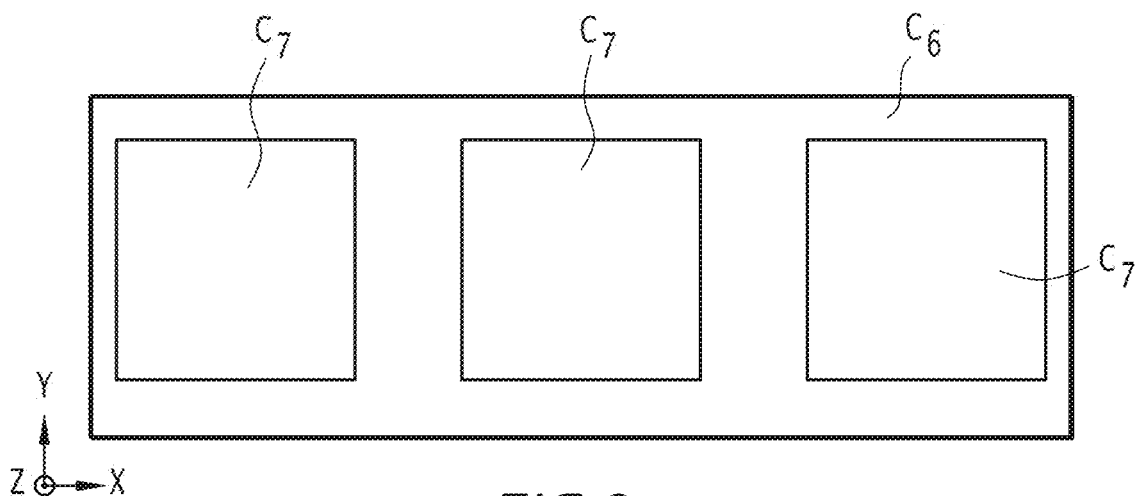
FIG. 9 shows a schematic view from above of the photodetector of FIG. 8.

FIG. 9 shows a top view of the photodetector Pd according to the sixth embodiment. FIG. 9 shows, in particular, the matrix of pixels formed by the stack and the fact that each part $P_7$ of the seventh layer $C_7$ makes contact with a pixel.

In what follows, only the differences in operation of the photodetector Pd according to the sixth embodiment with respect to the first embodiment are highlighted.

The charge carriers present in the fourth layer $C_4$ are led towards the parts $P_7$ of the seventh layer $C_7$ which are geographically closest to the charge carriers.

Each part $P_7$ then produces a current.

The sixth layer $C_6$ makes it possible to limit the oxidation of the structure and in particular of the first layer $C_1$ and of the third layer $C_3$ in the long term.

In what follows, only the differences in the method of manufacturing the photodetector Pd according to the sixth embodiment with respect to the first embodiment are highlighted.

The fourth layer $C_4$ is continuous.

The method then comprises epitaxially growing the sixth layer $C_6$ on the fourth layer $C_4$ so that the sixth layer $C_6$ completely covers the fourth layer $C_4$.

Then, the process comprises depositing the seventh layer $C_7$ followed by removal of certain portions of the seventh layer $C_7$ to form the parts $P_7$ of the seventh layer $C_7$. The epitaxial technique used is, for example, chosen from: dry epitaxy, wet epitaxy and plasma reactive ion epitaxy.

Thus, the preparation of the stack according to the sixth embodiment is facilitated with respect to the preceding embodiments. When the seventh material $M_7$ is InAsSb, and the sixth material $M_6$ is GaSb, the epitaxy of the seventh layer $C_7$ is very selective and allows, then, to stop the epitaxy on the surface of the sixth layer $C_6$. This makes it possible to minimize the thickness of the sixth layer $C_6$ and thus to minimize the effect of the sixth layer $C_6$ on the electrical properties of the stack. The sixth layer $C_6$ does not oxidize and thus protects the fourth layer $C_4$.

Thus, the presence of the first layer $C_1$, the second layer $C_2$, the third layer $C_3$ and the fourth layer $C_4$ is a common feature of the embodiments shown in FIGS. 1 to 9. In addition, for each of the six embodiments shown in FIGS. 1 to 9, the method of manufacturing the photodetector Pd comprises an epitaxial growth step for the first layer $C_1$, the second layer $C_2$, the third layer $C_3$ and the fourth layer $C_4$.

Other non-illustrated variants of a photodetector Pd are also envisaged:
- the combination of the preceding variants, for example a photodetector Pd comprising contacts C in contact with diffusion zones D according to the second embodiment, and further comprising other contacts C directly in contact with the third layer; $C_3$ according to the third embodiment,
- a number of guard rings different from the number of openings $O_4$ of the fourth layer $C_4$,
- the presence of guard rings around certain pixels and the absence of guard rings around other pixels,
- the presence of a first intermediate layer between the first layer $C_1$ and the second layer $C_2$, on the one hand, and a second intermediate layer between the second layer $C_2$ and the third layer $C_3$, on the other hand. Such intermediate layers are, in particular, described in the article by M. Carras et al. entitled "Interface band gap engineering in InAsSb photodiodes" published in 2005 in volume 87 of the journal Applied Physics Letters on pages 102103 to 102103-3. The first and second intermediate layer make it possible, in particular, to avoid carrier accumulations that may give rise to an interband type recombination.

It is more generally noted that the invention is not limited to the examples described and shown.

In addition, persons skilled in the art understand that the term "lightly doped" means a doping rate of less than $10^{17}$ cm$^{-3}$.

The invention claimed is:

1. A photodetector comprising:
    a stack of superimposed layers comprising, successively in a stacking direction:
        a first layer forming a substrate made of a first semiconductor material,
        a second layer forming a photo-absorbent layer made of a second semiconductor material having a second gap,
        a third layer forming a barrier layer made of a third semiconductor material, and
        a fourth layer forming a window layer made of a fourth semiconductor material, the window layer being a barrier layer enabling reduction of parasitic effects of surface recombination of electrostatic shielding associated with electrical doping of the fourth layer,
        the first material, the third material, and the fourth material each having a gap greater than the second gap,
        the fourth material being n-doped or undoped and the third material being undoped or weakly p-doped when the second material is n-doped, and
        the fourth material being p-doped or undoped and the third material being undoped or slightly n-doped when the second material is p-doped,
        wherein a doping rate of the fourth material is between $10^{15}$ cm$^{-3}$ and $10^{17}$ cm$^{-3}$.

2. The photodetector according to claim 1, wherein the thickness of the fourth layer in the stacking direction is between 100 nanometers and 500 nanometers.

3. The photodetector according to claim 2, wherein the thickness of the fourth layer in the stacking direction is between 200 nanometers and 300 nanometers.

4. The photodetector according to claim 1, further comprising a fifth layer superimposed on the fourth layer, the fourth layer being between the third layer and the fifth layer, and the fifth layer forming a passivation layer.

5. The photodetector according to claim 1, further comprising:
    a sixth layer superimposed on the fourth layer, the fourth layer being between the third layer and the sixth layer, the sixth layer forming a passivation layer,
    a seventh layer superimposed on the sixth layer, the seventh layer forming a current collection layer.

6. The photodetector according to claim 1, wherein the stack of layers comprises contacts made of semiconductor material, each contact having an end portion in contact with the third layer.

7. The photodetector according to claim 6, further comprising guard rings surrounding the contacts.

8. The photodetector according to claim 1, wherein the fourth layer has diffused zones, the stack of layers comprising contacts made of semiconductor material conductor, each contact having an end portion in contact with at least one diffused zone.

9. The photodetector according to claim 1, wherein the second material, the third material, and the fourth material are semiconductor materials based on columns IIIA and VA of the Periodic Table.

10. The photodetector according to claim 1, wherein the fourth material is of the form $GaSb_yAs_{1-y}$, y being a number between 0 and 1.

11. The photodetector according to claim 10, wherein the fourth material is gallium antimonide (GaSb).

12. A method of manufacturing the photodetector according to claim 1, the method comprising:
   for each of the layers, an epitaxial growth step.

13. The photodetector according to claim 1, wherein the fourth layer has openings distributed at regular intervals on the fourth layer.

14. The photodetector according to claim 13, wherein each of the openings traverses integrally through the fourth layer in the stacking direction, each of the openings delimiting a portion of the third layer.

* * * * *